(12) United States Patent
Yi

(10) Patent No.: US 9,425,238 B2
(45) Date of Patent: Aug. 23, 2016

(54) SEMICONDUCTOR DEVICE AND METHOD FOR FABRICATING THE SAME

(71) Applicant: SK hynix Inc., Gyeonggi-do (KR)

(72) Inventor: Jae-Yun Yi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/882,183

(22) Filed: Oct. 13, 2015

(65) Prior Publication Data

US 2016/0043138 A1 Feb. 11, 2016

Related U.S. Application Data

(62) Division of application No. 12/982,122, filed on Dec. 30, 2010, now Pat. No. 9,165,930.

(30) Foreign Application Priority Data

Jul. 15, 2010 (KR) .......................... 10-2010-0068245

(51) Int. Cl.
| | | |
|---|---|---|
| *H01L 29/78* | (2006.01) | |
| *H01L 27/24* | (2006.01) | |
| *H01L 27/105* | (2006.01) | |
| *H01L 29/786* | (2006.01) | |
| *H01L 45/00* | (2006.01) | |
| *H01L 27/06* | (2006.01) | |

(52) U.S. Cl.
CPC ........ *H01L 27/2436* (2013.01); *H01L 27/0688* (2013.01); *H01L 27/105* (2013.01); *H01L 27/1052* (2013.01); *H01L 27/24* (2013.01); *H01L 29/7869* (2013.01); *H01L 45/085* (2013.01); *H01L 45/1233* (2013.01); *H01L 45/1253* (2013.01); *H01L 45/146* (2013.01); *H01L 45/16* (2013.01); *H01L 27/0629* (2013.01)

(58) Field of Classification Search
CPC ................ H01L 29/7869; H01L 21/00; H01L 21/02554; H01L 21/02565; H01L 21/76897; H01L 21/823462; H01L 21/823425; H01L 45/085; H01L 45/1233; H01L 45/1253; H01L 45/146
USPC .................................................. 438/104, 279
See application file for complete search history.

(56) References Cited

U.S. PATENT DOCUMENTS 8,329,537 B2 * 12/2012 Kim ...................... H01L 21/321
257/E21.212

\* cited by examiner

*Primary Examiner* — Monica D Harrison
(74) *Attorney, Agent, or Firm* — IP & T Group LLP

(57) ABSTRACT

A semiconductor device includes a memory block including a transistor region and a memory region. A variable resistance layer of the memory region acts as a gate insulating layer in the transistor region.

11 Claims, 10 Drawing Sheets

SEMICONDUCTOR DEVICE AND METHOD FOR FABRICATING THE SAME

CROSS-REFERENCE TO RELATED APPLICATION

This application is a division of U.S. patent application Ser. No. 12/982,122 filed on Dec. 30, 2010, which claims priority of Korean Patent Application No. 10-2010-0068245, filed on Jul. 15, 2010. The disclosure of each of the foregoing applications is incorporated herein by reference in its entirety.

BACKGROUND OF THE INVENTION

Exemplary embodiments of the present invention relate to semiconductor device fabrication technology, and more particularly, to a semiconductor device having a resistive memory and a method for fabricating the same.

Extensive research is being conducted on next-generation memory devices that can replace dynamic random access memory (DRAM) devices and flash memory devices. Examples of the next-generation memory devices include resistive memory (ReRAM) devices. The resistive memory devices provide good characteristics at low fabrication costs. In particular, the resistive memory devices are esteemed as high-capacity memory devices because they have a very simple stacked structure of metal-insulator-metal.

A stacked structure, including a plurality of crossbar type memory arrays, is especially esteemed as a structure for a high-capacity memory device using a resistive memory device.

However, implementing a high-capacity memory device by stacking a plurality of memory arrays requires interconnections and contacts for connecting the memory array of each layer to peripheral circuits such as a driver and a sense amplifier (SA) formed on a substrate. These interconnections and contacts increase the size of a semiconductor device and degrade the operation characteristics.

Specifically, in order to form the contacts for connecting the memory array of each layer to the peripheral circuits, a separate space for the contacts should be prepared at the center or the edge of the memory array of each layer, thus increasing the size of the semiconductor device. Also, the structure of interconnections for connection of the contacts formed in a plurality of layers is complicated and the space occupied for forming the interconnections is increased, thus further increasing the size of the semiconductor device.

Also, as a design rule decreases, the critical dimension of an interconnection decreases, thus increasing the resistance of the interconnection. The increase in the resistance of the interconnection may cause a loading resistance to be connected to the resistive memory device, thus making it difficult to accurately control the resistive memory device formed in each layer.

SUMMARY OF THE INVENTION

Exemplary embodiments of the present invention are directed to a semiconductor device and a method for fabricating the same, which can reduce the size of a high-capacity memory device.

In accordance with an exemplary embodiment of the present invention, a semiconductor device includes a plurality of memory blocks including a transistor region and a memory region, wherein a variable resistance layer of the memory region acts as a gate insulating layer in the transistor region. The memory blocks may be stacked on a substrate including a predetermined structure, and an interlayer dielectric may be inserted between the memory blocks.

The variable resistance layer and the gate insulating layer may be connected to each other, or may be disconnected from each other.

The memory region may include a plurality of first conductive lines disposed on an interlayer dielectric under the variable resistance layer, and a plurality of second conductive lines disposed on the variable resistance layer crossing over the first conductive lines.

The transistor region may include a plurality of gate electrodes disposed on an interlayer dielectric under the gate insulating layer, a channel layer disposed on the gate insulating layer to overlap the gate electrodes, and a plurality of source electrodes and drain electrodes disposed on the channel layer to overlap a portion of the gate electrodes. The channel layer may include an oxide layer or a silicon layer. The oxide layer may include at least one material selected from the group consisting of an indium oxide layer, a zirconium oxide layer, a gallium oxide layer, and a tin oxide layer. The variable resistance layer may include an oxide layer, and the oxide layer may include a plurality of oxygen vacancies.

In accordance with another exemplary embodiment of the present invention, a semiconductor device includes a plurality of memory blocks including a transistor region and a memory region, wherein a variable resistance layer of the memory region has a sequential stack structure of a first insulating layer and a second insulating layer, the first insulating layer acts as a gate insulating layer in the transistor region, and the second insulating layer acts as a channel layer in the transistor region. The memory blocks may be stacked on a substrate including a predetermined structure, and an interlayer dielectric may be inserted between the memory blocks.

The first insulating layer and the gate insulating layer may be connected to each other, or may be disconnected from each other. The second insulating layer and the channel layer may be connected to each other, or may be disconnected from each other.

The memory region may include a plurality of first conductive lines disposed on an interlayer dielectric under the first insulating layer, and a plurality of second conductive lines disposed on the second insulating layer crossing over the first conductive lines.

The transistor region may include a plurality of gate electrodes disposed on an interlayer dielectric under the gate insulating layer, and a plurality of source electrodes and drain electrodes disposed on the channel layer to overlap a portion of the gate electrodes. The first insulating layer and the second insulating layer may include an oxide layer, and the oxide layer may include a plurality of oxygen vacancies. The second insulating layer may include at least one material selected from the group consisting of an indium oxide layer, a zirconium oxide layer, a gallium oxide layer, and a tin oxide layer.

In accordance with still another exemplary embodiment of the present invention, a semiconductor device includes a transistor, and a memory cell, wherein a variable resistance layer of the memory cell is the same material and on the same plane as a gate insulating layer of the transistor.

In accordance with yet another exemplary embodiment of the present invention, a method for fabricating a semiconductor device includes forming an interlayer dielectric defining a transistor region and a memory region forming a plurality of gate electrodes on the interlayer dielectric in the transistor region and forming a plurality of first conductive lines on the interlayer dielectric in the memory region, forming a first insulating layer on the interlayer dielectric, forming a second insulating layer on the first insulating layer, forming a first electrode and a second electrode on the second insulating layer in the transistor region to overlap a portion of the gate electrode and forming a plurality of second conductive lines crossing over the first conductive lines in the memory region, and applying a bias voltage to the first and second conductive lines to perform a conductive path forming process.

The method may further include exposing the first insulating layer of the memory region by selectively etching the second insulating layer, after the forming of the second insulating layer.

The method may further include dividing the second insulating layer of the transistor region and the second insulating layer of the memory region by selectively etching the second insulating layer, after the forming of the second insulating layer.

The method may further include dividing the first insulating layer of the transistor region and the first insulating layer of the memory region by selectively etching the first insulating layer, after the forming of the second insulating layer.

The first insulating layer and the second insulating layer may include an oxide layer, and the oxide layer may include a plurality of oxygen vacancies. The second insulating layer may include at least one material selected from the group consisting of an indium oxide layer, a zirconium oxide layer, a gallium oxide layer, and a tin oxide layer.

In accordance with still another exemplary embodiment of the present invention, a method for fabricating a semiconductor device includes forming a variable resistance layer in a memory region of a memory block, and forming a gate insulating layer in a transistor region of the memory block, wherein the variable resistance layer and the gate insulating layer are simultaneously formed.

DESCRIPTION OF SPECIFIC EMBODIMENTS

Figure 1A:
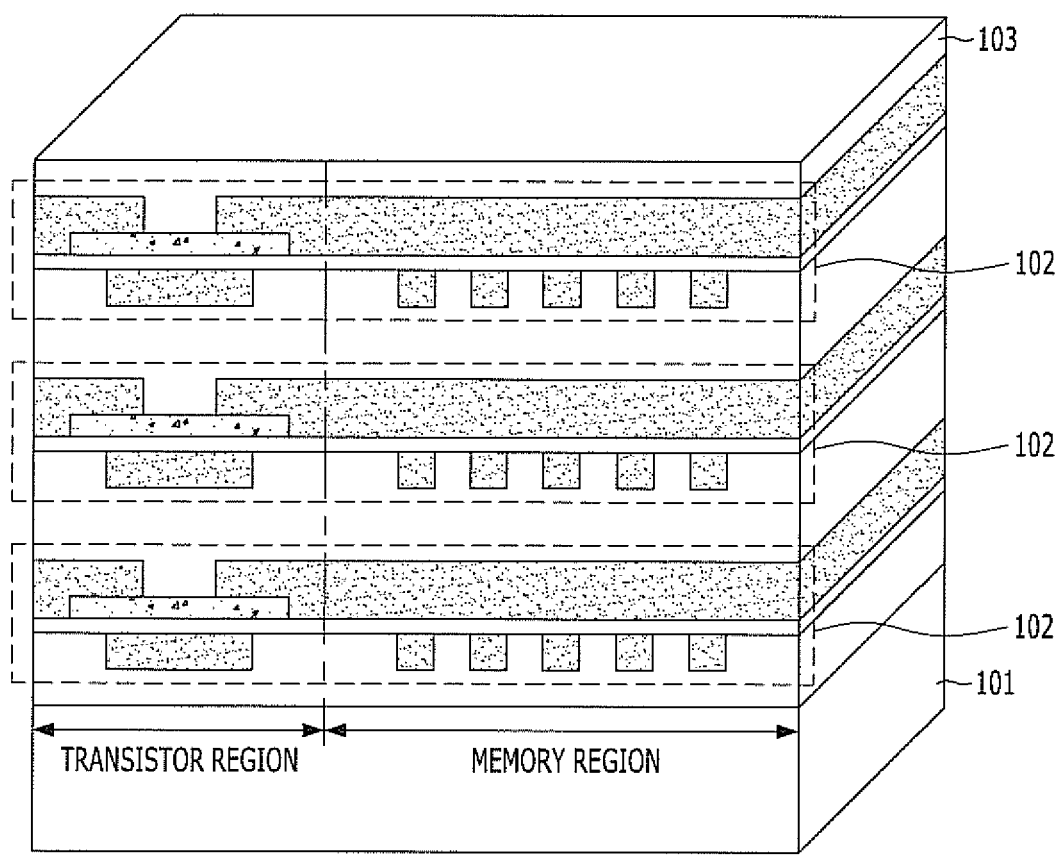
FIG. 1A is a perspective view illustrating a semiconductor device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

The present invention provides a semiconductor device and a method for fabricating the same, which can effectively reduce the size of a high-capacity memory device. To this end, the present invention provides a semiconductor device integrating a peripheral circuit and a resistive memory device in which a plurality of memory blocks are stacked and each memory block has a crossbar type array structure. Herein, the peripheral circuit includes a driver for driving the resistive memory device and a sense amplifier (SA) for detecting stored data. As is well known in the art, a peripheral circuit such as a sense amplifier includes a plurality of transistors and is configured with a combination thereof.

Hereinafter, for convenience in description, a description will be given of exemplary embodiments in which a semiconductor device has a stack structure of three memory blocks. However, the present invention is not limited thereto. That is, in other exemplary embodiments, a semiconductor device may have a stack structure with less than or more than three memory blocks.

Figure 1B:
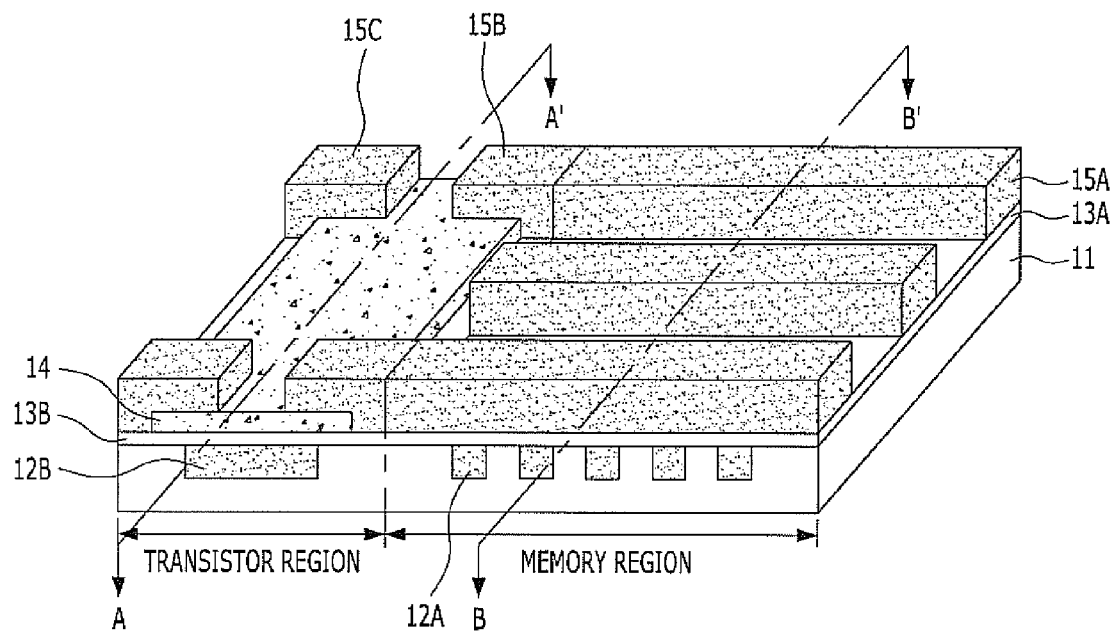
FIG. 1B is a partial perspective view illustrating one memory block in accordance with the first exemplary embodiment of the present invention.
Figure 1C:
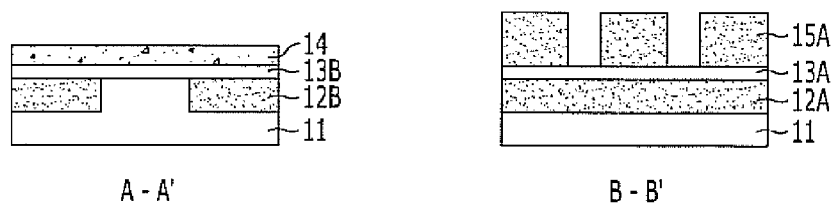
FIG. 1C shows cross-sectional views taken along lines A-A' and B-B' of FIG. 1B.

FIGS. 1A to 1C are views illustrating a semiconductor device in accordance with a first exemplary embodiment of the present invention. FIG. 1A is a perspective view illustrating a semiconductor device in accordance with a first exemplary embodiment of the present invention. FIG. 1B is a partial perspective view illustrating one memory block in accordance with the first exemplary embodiment of the present invention. FIG. 1C shows cross-sectional views taken along lines A-A' and B-B' of FIG. 1B.

Referring to FIGS. 1A to 1C, a semiconductor device in accordance with the first exemplary embodiment of the present invention includes a substrate 101 having a predetermined structure formed therein, a plurality of memory blocks 102 stacked on the substrate 101, and a passivation layer 103 formed on the top layer.

The substrate 101 may include various semiconductor devices such as a power device, a high voltage device, a display driver IC (DDI) device, and a bipolar-CMOS-DMOS (BCD) device.

Each of the memory blocks 102 has a transistor region where a peripheral circuit is formed, and a memory region where a resistive memory device is formed. In the first exemplary embodiment of the present invention, a variable resistance layer 13A of the memory region acts as a gate insulating layer 13B in the transistor region. That is, the variable resistance layer 13A and the gate insulating layer 13B are simultaneously formed of the same material and are disposed on the same plane. As illustrated in FIG. 1B, the variable resistance layer 13A may be connected to the gate insulating layer 13B. Although not illustrated in the drawings, in other embodiments, the variable resistance layer 13A and the gate insulating layer 13B may not be connected to each other.

The memory region includes an interlayer dielectric 11, a plurality of first conductive lines 12A formed on the interlayer dielectric 11 to act as a bottom electrode (BE), a variable resistance layer 13A formed on the interlayer dielectric 11 to contact the first conductive lines 12A, and a plurality of second conductive lines 15A formed on the variable resistance layer 13A to act as a top electrode (TE). The second conductive lines 15A are arranged so that they cross over the first conductive lines 12A. That is, a resistive memory device formed in the memory region has a crossbar type array structure where the variable resistance layer 13A is disposed between the crossing first and second conductive lines 12A and 15A.

The transistor region includes an interlayer dielectric 11, a plurality of gate electrodes 12B formed on the interlayer dielectric 11, a gate insulating layer 13B formed on the interlayer dielectric 11 to contact the gate electrodes 12B, a channel layer 14 formed on the gate insulating layer 13B to overlap the gate electrodes 12B, and first electrodes (or drain electrodes) 15B and second electrodes (or source electrodes) 15C formed on the channel layer 14 to overlap a portion of corresponding gate electrodes 12B. Herein, the first electrodes 15B may be connected to corresponding second conductive lines 15A of the memory region.

The variable resistance layer 13A of the memory region extends to the transistor region to act as the gate insulating layer 13B. Therefore, the variable resistance layer 13A of the memory region and the gate insulating layer 13B of the transistor region may be formed of the same material. Also, the variable resistance layer 13A and the gate insulating layer 13B are simultaneously formed through the same process, and are disposed on the same plane. Also, the variable resistance layer 13A and the gate insulating layer 13B have a thickness of approximately 1 nm to approximately 100 nm.

The variable resistance layer 13A may be an oxide layer including a plurality of oxygen vacancies. Herein, the oxygen vacancies serve to change the resistance of the variable resistance layer 13A. Specifically, the variable resistance layer 13A has a conductive path created by the oxygen vacancies through a conductive path forming process that rearranges the oxygen vacancies by applying a high voltage to the first conductive line 12A and the second conductive line 15A. Whether or not an operation voltage (lower than the high voltage applied in the conductive path forming process) is applied to the first conductive line 12A and the second conductive line 15A determines whether or not the conductive path connects the first conductive line 12A and the second conductive line 15A. In this manner, the resistance of the variable resistance layer 13A may be changed and the change may be used to store data.

Since the variable resistance layer 13A and the gate insulating layer 13B are formed of the same material, the gate insulating layer 13B also includes a plurality of oxygen vacancies. Even when the gate insulating layer 13B includes a plurality of oxygen vacancies, because the conductive path by the oxygen vacancies is not created through the conductive path forming process, it does not have variable resistance characteristics like the variable resistance layer 13A. Thus, the gate insulating layer 13B has insulating characteristics even though it includes oxygen vacancies like the variable resistance layer 13A formed of the same material.

The variable resistance layer 13a may include at least one material selected from the group consisting of silicon (Si) oxide, aluminum (Al) oxide, hafnium (Hf) oxide, zirconium (Zr) oxide, lanthanum (La) oxide, titanium (Ti) oxide, niobium (Nb) oxide, tantalum (Ta) oxide, nickel (Ni) oxide, strontium-titanium (SrTi) oxide, barium-titanium (BaTi) oxide, and barium-strontium (BaSr) oxide.

The first conductive line 12A and the gate electrode 12B disposed on the same plane may include the same material. Also, the first conductive line 12A and the gate electrode 12B may be simultaneously formed through the same process.

Herein, the first conductive line 12A, the gate electrode 12B, the second conductive line 15A, the first electrode 15B, and the second electrode 15C may be a metallic layer. The metallic layer may include tungsten (W), tantalum (Ta), platinum (Pt), titanium nitride (TiN), or tantalum nitride (TaN).

The channel layer 14 of the transistor region may have a thickness of approximately 1 nm to approximately 100 nm, and may include a silicon layer or an oxide layer. Herein, the silicon layer may include a polysilicon (poly Si) layer. Also, the oxide layer may include at least one material selected from the group consisting of indium oxide ($In_2O_3$), zirconium oxide (ZnO), gallium oxide ($Ga_2O_3$), and tin oxide ($SnO_2$). The oxide layer for the channel layer 14 has semiconductor characteristics due to its atomic bond (e.g., metal-oxygen bond). Also, it is know that the oxide layer has a wide band gap and a high carrier mobility. For reference, the wide band gap means a band gap of more than 3.5 eV.

In the semiconductor device in accordance with the first exemplary embodiment of the present invention, the memory device and the peripheral circuit are integrated in one memory block 102. Accordingly, the present invention does not require a separate interconnection and contact for connecting the peripheral circuit and the memory device. Therefore, the present invention can provide a high-capacity memory device having a reduced chip size. Also, the present invention can simplify the fabrication process of a high-capacity memory device.

Conventionally, a peripheral circuit for a memory device is formed on the substrate 101. However, the present invention does not need to form a peripheral circuit for a memory device on the substrate 101. Thus, various semiconductor devices can be formed in a space typically used for a peripheral circuit and for interconnections and contacts. Accordingly, an embedded system with a high-capacity memory device can be constructed with a reduced chip size.

Figure 2A:
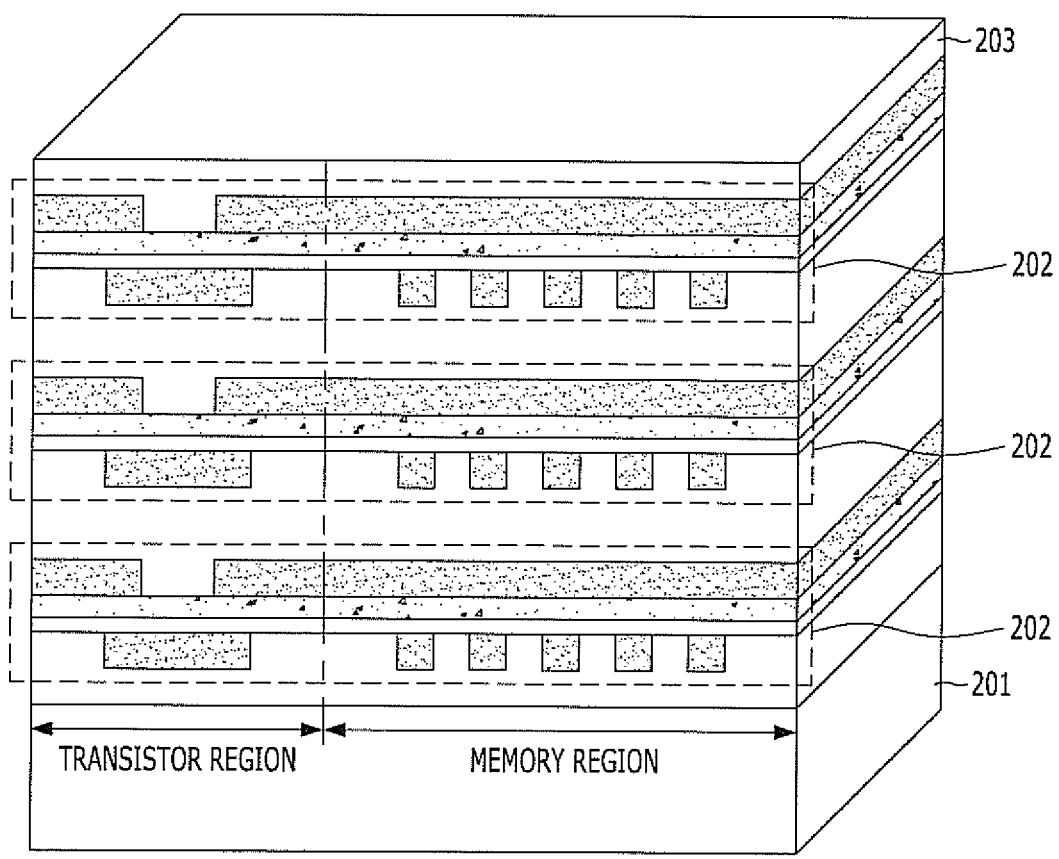
FIG. 2A is a perspective view illustrating a semiconductor device in accordance with a second exemplary embodiment of the present invention.
Figure 2B:
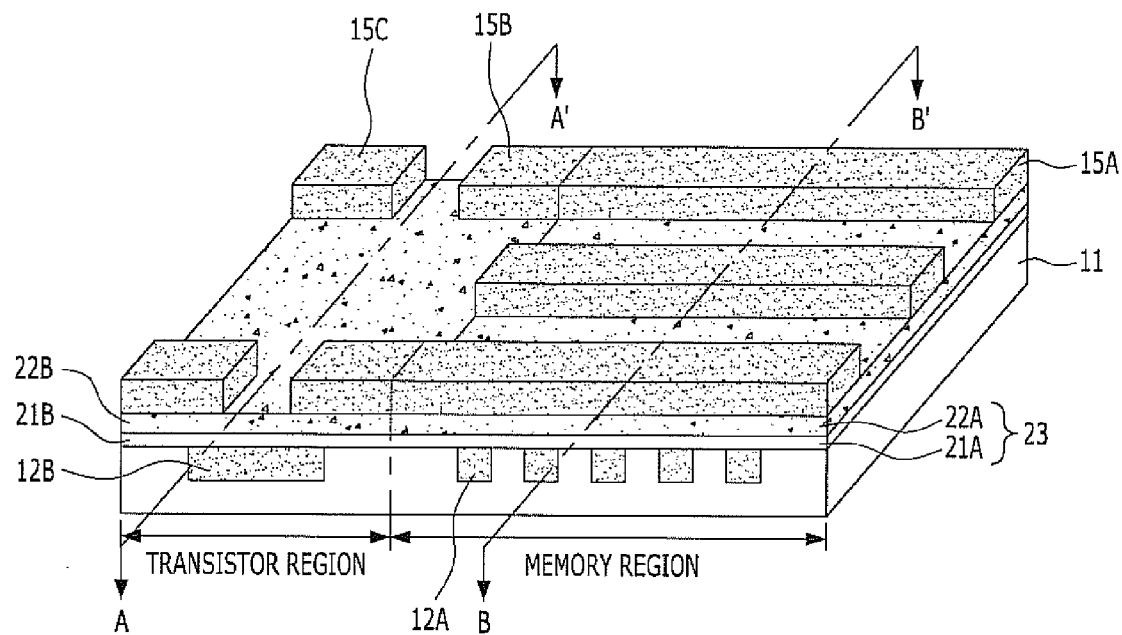
FIG. 2B is a partial perspective view illustrating one memory block in accordance with the second exemplary embodiment of the present invention.
Figure 2C:
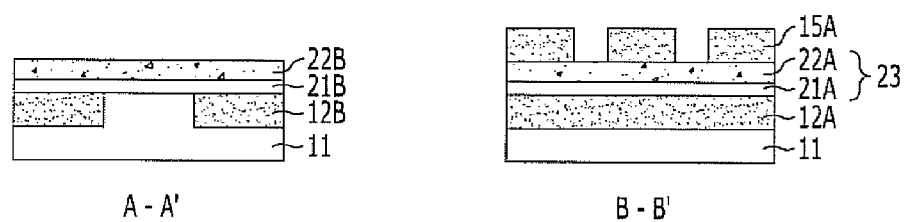
FIG. 2C shows cross-sectional views taken along lines A-A' and B-B' of FIG. 2B.

FIGS. 2A to 2C are views illustrating a semiconductor device in accordance with a second exemplary embodiment of the present invention. FIG. 2A is a perspective view illustrating a semiconductor device in accordance with the second exemplary embodiment of the present invention. FIG. 2B is a partial perspective view illustrating one memory block in accordance with the second exemplary embodiment of the present invention. FIG. 2C shows cross-sectional views taken along lines A-A' and B-B' of FIG. 2B.

Hereinafter, for convenience in description, like reference numerals are used to denote like elements throughout the first and second exemplary embodiments of the present invention.

Referring to FIGS. 2A to 2C, a semiconductor device in accordance with the second exemplary embodiment of the present invention includes a substrate 201 having a predetermined structure formed therein, a plurality of memory blocks 202 stacked on the substrate 201, and a passivation layer 203 formed on the top layer.

The memory block 202 has a transistor region where a peripheral circuit is formed, and a memory region where a resistive memory device is formed. In the second exemplary embodiment of the present invention, a variable resistance layer 23 of the memory region acts as a gate insulating layer 21B and a channel layer 22B in the transistor region. Specifically, the variable resistance layer 23 has a sequential stack of a first oxide layer 21A and a second oxide layer 22A, wherein the first oxide layer 21A acts as the gate insulating layer 21B in the transistor region and the second oxide layer 22A acts as the channel layer 22B in the transistor region. That is, the first oxide layer 21A and the gate insulating layer 21B are simultaneously formed of the same material and are disposed on the same plane. As illustrated in the drawings, the first oxide layer 21A may be connected to the gate insulating layer 21B. Also, the second oxide layer 22A and the channel layer 22B are simultaneously formed of the same material and are disposed on the same plane. As illustrated in the drawings, the second oxide layer 22A may be connected to the channel layer 22B.

The memory region includes an interlayer dielectric 11, a plurality of first conductive lines 12A formed on the interlayer dielectric 11 to act as a bottom electrode (BE), a first oxide layer 21A formed on the interlayer dielectric 11 to contact the first conductive lines 12A, a second oxide layer 22A formed on the first oxide layer 21A, and a plurality of second conductive lines 15A formed on the second oxide layer 22A to act as a top electrode (TE). The second conductive lines 15A are arranged so that they cross over the first conductive lines 12A. That is, a resistive memory device formed in the memory region has a crossbar type array structure where the variable resistance layer 23 is disposed between the crossing first and second conductive lines 12A and 15A.

The transistor region includes an interlayer dielectric 11, a plurality of gate electrodes 12B formed on the interlayer dielectric 11, a gate insulating layer 21B formed on the interlayer dielectric 11 to contact the gate electrodes 12B, a channel layer 22B formed on the gate insulating layer 21B to overlap the gate electrodes 12B, and first electrodes (or drain electrodes) 15B and second electrodes (or source electrodes) 15C formed on the channel layer 22B to overlap a portion of corresponding gate electrodes 12B. Herein, the first electrodes 15B may be connected to corresponding second conductive lines 15A of the memory region.

The first oxide layer 21A acting as the variable resistance layer 23 in the memory region extends to the transistor region to act as the gate insulating layer 21B. Therefore, the first oxide layer 21A and the gate insulating layer 21B may be formed of the same material. Also, the first oxide layer 21A and the gate insulating layer 21B are simultaneously formed through the same process, and are disposed on the same plane. Also, the first oxide layer 21A and the gate insulating layer 21B have a thickness of approximately 1 nm to approximately 100 nm.

The second oxide layer 22A acting as the variable resistance layer 23 in the memory region extends to the transistor region to act as the channel layer 22B. Therefore, the second oxide layer 22A and the channel layer 22B may be formed of the same material. Also, the second oxide layer 22A and the channel layer 22B are simultaneously formed through the same process, and are disposed on the same plane. Also, the second oxide layer 22A and the channel layer 22B have a thickness of approximately 1 nm to approximately 100 nm.

The first oxide layer 21A and the second oxide layer 22A acting as the variable resistance layer 23 may include a plurality of oxygen vacancies. Herein, the oxygen vacancies serve to change the resistance of the variable resistance layer 23. Specifically, the variable resistance layer 23 has a conductive path created by the oxygen vacancies through a conductive path forming process that rearranges the oxygen vacancies by applying a high voltage to the first conductive line 12A and the second conductive line 15A. Whether or not an operation voltage (lower than the high voltage applied in the conductive path forming process) is applied to the first conductive line 12A and the second conductive line 15A determines whether or not the conductive path connects the first conductive line 12A and the second conductive line 15A. In this manner, the resistance of the variable resistance layer 23 may be changed and the change may be used to store data.

Since the gate insulating layer 21B and the channel layer 22B are formed of the same materials as the first oxide layer 21A and the second oxide layer 22A, respectively, they also may include a plurality of oxygen vacancies. However, even though the gate insulating layer 21B and the channel layer 22B include a plurality of oxygen vacancies, they do not have variable resistance characteristics like the variable resistance layer 23. The gate insulating layer 21B and the channel layer 22B do not have variable resistance characteristics because the conductive path forming process is not performed on the oxygen vacancies in the transistor region, and thus, a conductive path is not created in the transistor region. Thus, the gate insulating layer 21B and the channel layer 22B maintain their own physical properties even though they are formed of the same material as the variable resistance layer 23, and therefore include oxygen vacancies. That is, the gate insulating layer 21B has insulating characteristics even though it includes oxygen vacancies; and the channel layer 22B has semiconductor characteristics even though it includes oxygen vacancies.

The gate insulating layer 21B and the first oxide layer 21A may include at least one material selected from the group consisting of silicon (Si) oxide, aluminum (Al) oxide, hafnium (Hf) oxide, zirconium (Zr) oxide, lanthanum (La) oxide, titanium (Ti) oxide, niobium (Nb) oxide, tantalum (Ta) oxide, nickel (Ni) oxide, strontium-titanium (SrTi) oxide, barium-titanium (BaTi) oxide, and barium-strontium (BaSr) oxide.

The channel layer 22B and the second oxide layer 22A may include at least one material selected from the group consisting of indium oxide ($In_2O_3$), zirconium oxide (ZnO), gallium oxide ($Ga_2O_3$), and tin oxide ($SnO_2$).

In the semiconductor device in accordance with the second exemplary embodiment of the present invention, the variable resistance layer 23 of the memory region extends to the transistor region to act as the gate insulating layer 21A and the channel layer 22B. Accordingly, the second exemplary embodiment of the present invention can simplify the fabrication process and the structure of the semiconductor device.

Figure 3A:
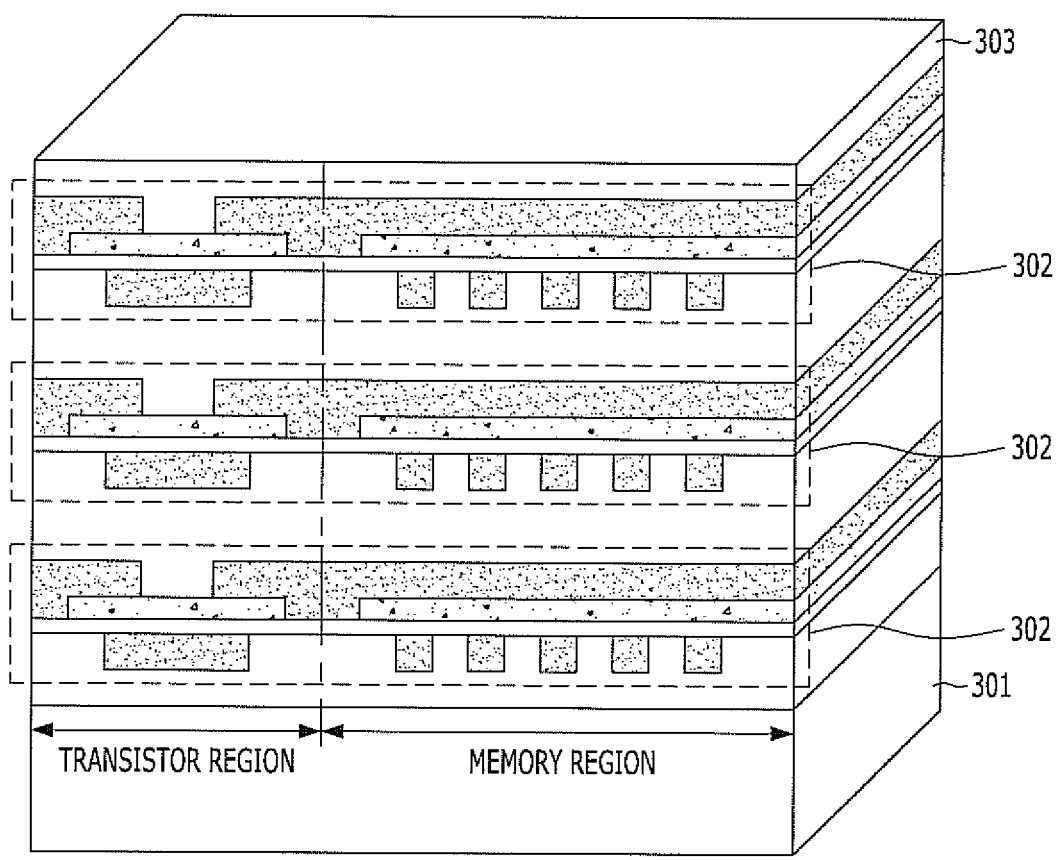
FIG. 3A is a perspective view illustrating a semiconductor device in accordance with a third exemplary embodiment of the present invention.
Figure 3B:
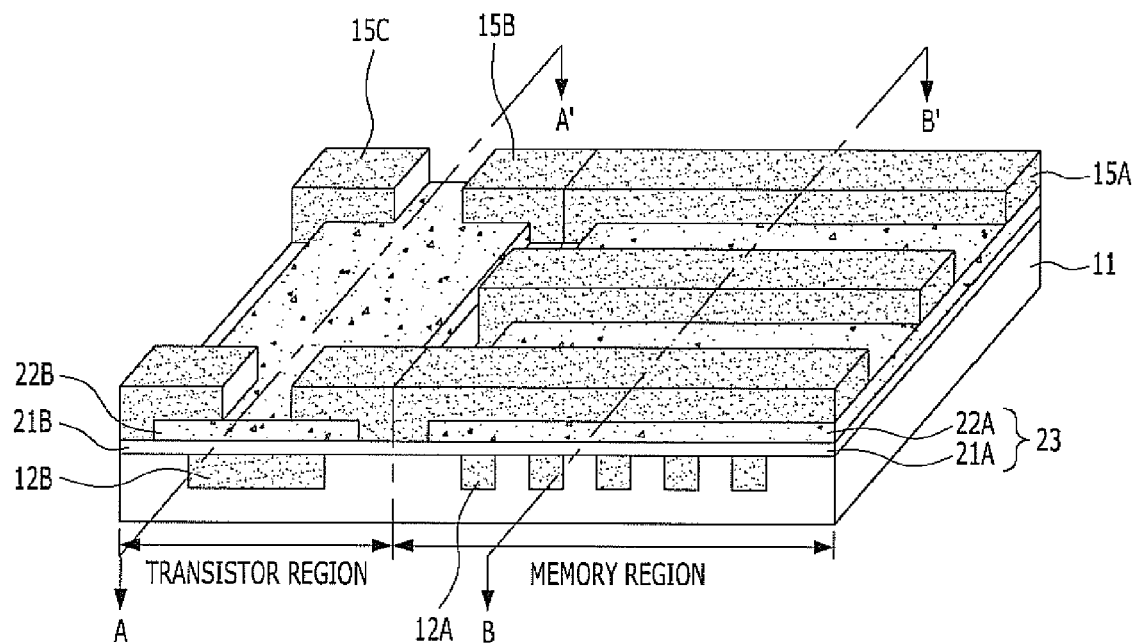
FIG. 3B is a partial perspective view illustrating one memory block in accordance with the third exemplary embodiment of the present invention.
Figure 3C:
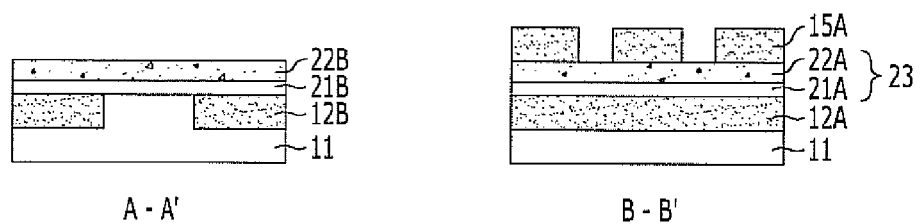
FIG. 3C shows cross-sectional views taken along lines A-A' and B-B' of FIG. 3B.

FIGS. 3A to 3C are views illustrating a semiconductor device in accordance with a third exemplary embodiment of the present invention. FIG. 3A is a perspective view illustrating a semiconductor device in accordance with the third exemplary embodiment of the present invention. FIG. 3B is a partial perspective view illustrating one memory block in accordance with the third exemplary embodiment of the present invention. FIG. 3C shows cross-sectional views taken along lines A-A' and B-B' of FIG. 3B.

Hereinafter, for convenience in description, like reference numerals are used to denote like elements throughout the second and third embodiments of the present invention.

As illustrated in FIGS. 3A to 3C, a semiconductor device in accordance with the third exemplary embodiment of the present invention is similar to the semiconductor device in accordance with the second exemplary embodiment of the present invention.

As shown in FIGS. 3A to 3C, the channel layer 22B in the transistor region is disconnected from the second oxide layer 22A acting as a variable resistance layer 23 in the memory region. Although the second oxide layer 22A and the channel layer 22B are disconnected from each other, they are simultaneously formed of the same material and are disposed on the same plane.

Although not illustrated in the drawings, the first oxide layer 21A and the gate insulating layer 21B may be disconnected from each other as well. Where the first oxide layer 21A and the gate insulating layer 21B are disconnected from each other, they still may be simultaneously formed of the same material and disposed on the same plane.

FIGS. 4A to 4D are perspective views illustrating a method for fabricating a semiconductor device in accordance with an exemplary embodiment of the present invention.

Herein, as an example, a description will be given of a method for fabricating a semiconductor device having the structure in accordance with the second exemplary embodiment of the present invention. From this description, similar methods for fabricating other exemplary embodiments should be understood.

Figure 4A:
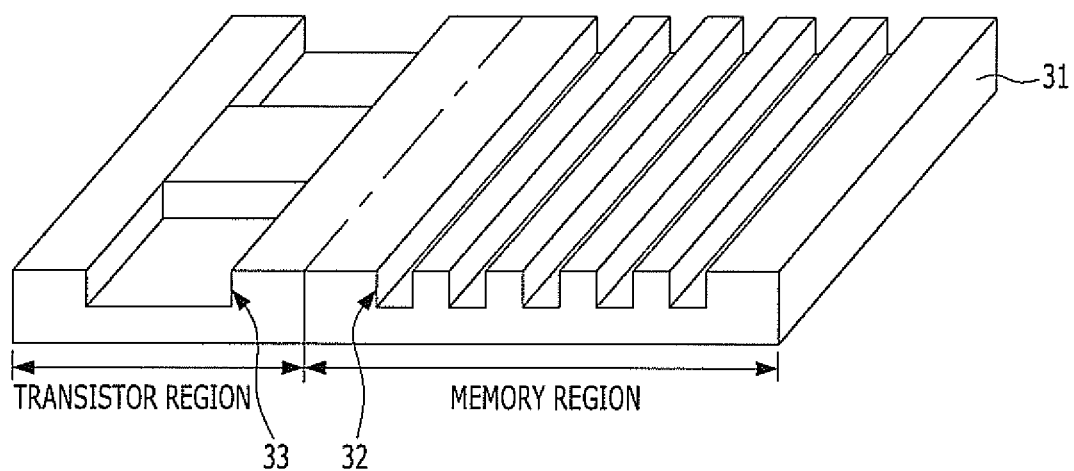
FIGS. 4A to 4D are perspective views illustrating a method for fabricating a semiconductor device in accordance with an exemplary embodiment of the present invention.

Referring to FIG. 4A, an interlayer dielectric 31, having a transistor region and a memory region, is selectively etched to form a first recess pattern 32 in the memory region and form a second recess pattern 33 in the transistor region.

Figure 4B:
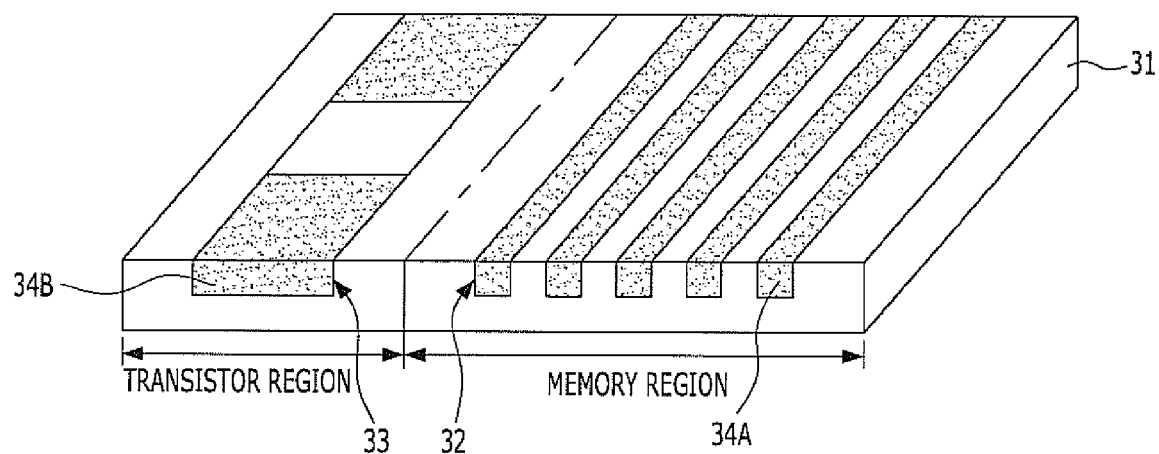

Referring to FIG. 4B, a conductive layer is deposited on the interlayer dielectric 31 to fill the first and second recess patterns 32 and 33. After the deposition of the conductive layer, a planarization process may be performed to expose the interlayer dielectric 31. The planarization process may be performed through a chemical mechanical polishing (CMP) process.

Through the above process, first conductive lines 34A filling the first recess pattern 32 and acting as bottom electrodes are formed in the memory region. Also, gate electrodes 34B filling the second recess pattern 33 are formed in the transistor region. Herein, the first conductive lines 34A and the gate electrodes 34B may include a metallic layer. The metallic layer may include tungsten (W), tantalum (Ta), platinum (Pt), titanium nitride (TiN), or tantalum nitride (TaN).

Figure 4C:
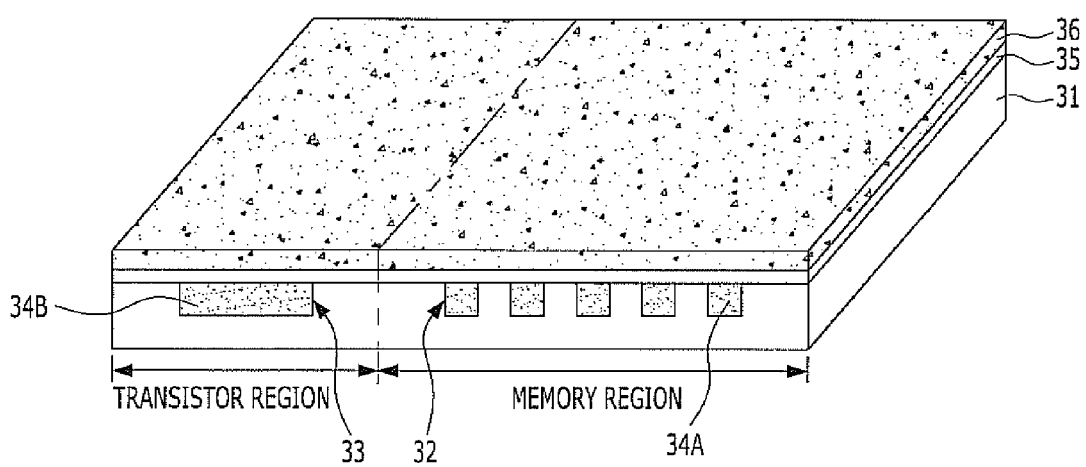

Referring to FIG. 4C, a first insulating layer 35 is formed over the interlayer dielectric 31 including the first conductive lines 34A and the gate electrodes 34B. Herein, the first insulating layer 35 acts as a variable resistance layer in the memory region, and acts as a gate insulating layer in the transistor region.

The first insulating layer 35 may include an oxide layer including oxygen vacancies. Specifically, the first insulating layer may be formed of at least one material selected from the group consisting of silicon (Si) oxide, aluminum (Al) oxide, hafnium (Hf) oxide, zirconium (Zr) oxide, lanthanum (La) oxide, titanium (Ti) oxide, niobium (Nb) oxide, tantalum (Ta) oxide, nickel (Ni) oxide, strontium-titanium (SrTi) oxide, barium-titanium (BaTi) oxide, and barium-strontium (BaSr) oxide.

A second insulating layer 36 is formed on the first insulating layer 35. Herein, the second insulating layer 36 acts as a variable resistance layer in the memory region in combination with the first insulating layer 35, and acts as a channel layer in the transistor region.

The second insulating layer 36 may include an oxide layer that contains oxygen vacancies and semiconductor characteristics. Specifically, the second insulating layer 36 may be formed of at least one material selected from the group consisting of indium oxide ($In_2O_3$), zirconium oxide (ZnO), gallium oxide ($Ga_2O_3$), and tin oxide ($SnO_2$).

After the second insulating layer 36 is formed, the second insulating layer 36 may be selectively etched to expose the first insulating layer 35 in the memory region, thereby forming the structure in accordance with the first exemplary embodiment of the present invention. After the second insulating layer 36 is selectively etched, the first insulating layer 35 may be selectively etched to divide the first insulating layer 35 of the transistor region and the first insulating layer 35 of the memory region.

Alternatively, after the second insulating layer 36 is formed, the second insulating layer 36 may be selectively etched to divide the second insulating layer 36 of the transistor region and the second insulating layer 36 of the memory region, thereby forming the structure in accordance with the third exemplary embodiment of the present invention. Herein, after the second insulating layer 36 is selectively etched, the first insulating layer 35 may be selectively etched to divide the first insulating layer 35 of the transistor region and the first insulating layer 35 of the memory region.

Figure 4D:
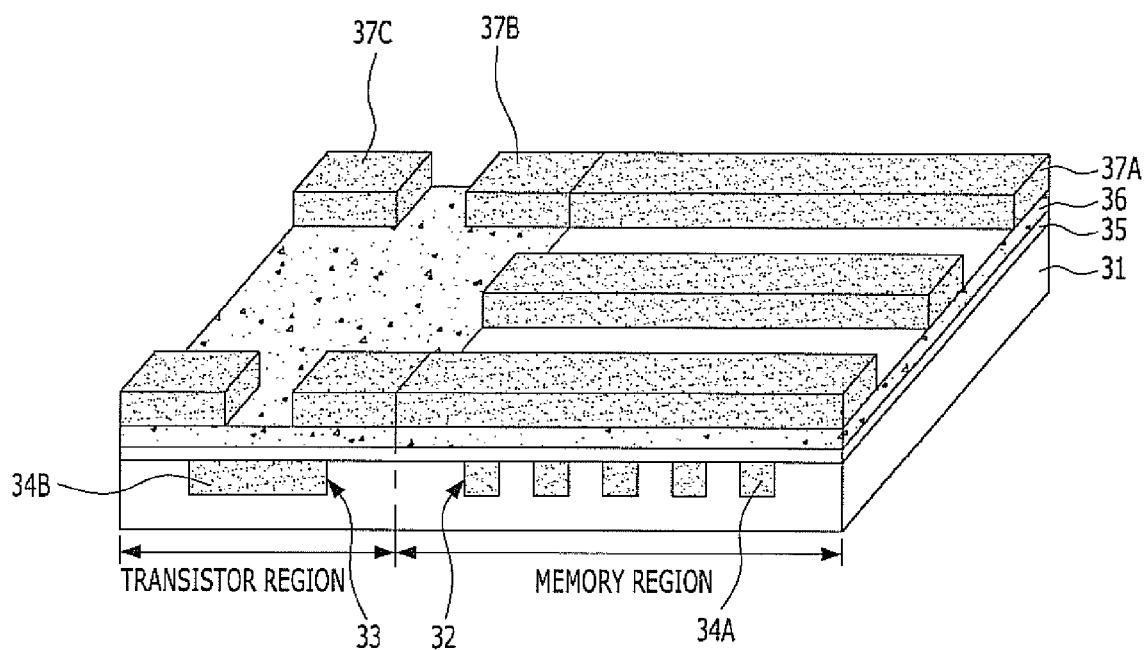

Referring to FIG. 4D, a conductive layer is deposited on the second insulating layer 36 and the conductive layer is selectively etched to form at least one second conductive line 37A acting as a top electrode of the memory region. While the second conductive line 37A, crossing over the first conductive lines 34A, is formed, a first electrode 37B and a second electrode 37C, acting as a source electrode and a drain electrode, are formed in the transistor region.

Herein, the second conductive line 37A, the first electrode 37B, and the second electrode 37C may include a metallic layer. The metallic layer may include tungsten (W), tantalum (Ta), platinum (Pt), titanium nitride (TiN), or tantalum nitride (TaN).

A high voltage is applied to the first conductive line 34A and the second conductive line 37A to perform a conductive path forming process that creates a conductive path using oxygen vacancies in the first and second insulating layers 35 and 36 formed in the memory region.

One memory block can be completed by the above processes. The above processes may be repeated to stack memory blocks on the substrate, thereby completing a semiconductor device with a high-capacity memory device.

As described above, the present invention integrates a memory region and a transistor region, which is used to drive the memory device, in one memory block. Accordingly, the present invention does not require a separate interconnection and contact for connecting the peripheral circuit and the memory device. Therefore, the present invention can implement a high-capacity memory device with a reduced chip size.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an interlayer dielectric defining a transistor region and a memory region;
   forming a plurality of gate electrodes on the interlayer dielectric in the transistor region and forming a plurality of first conductive lines on the interlayer dielectric in the memory region;
   forming a first insulating layer on the interlayer dielectric;
   forming a second insulating layer on the first insulating layer; and
   forming a first electrode and a second electrode on the second insulating layer in the transistor region to overlap a portion of the gate electrode and forming a plurality of second conductive lines crossing over the first conductive lines in the memory region.

2. The method of claim 1, further comprising:
exposing the first insulating layer in the memory region by selectively etching the second insulating layer, after the forming of the second insulating layer.

3. The method of claim 1, further comprising:
dividing the second insulating layer of the transistor region and the second insulating layer of the memory region by selectively etching the second insulating layer, after the forming of the second insulating layer.

4. The method of 3, further comprising:
dividing the first insulating layer of the transistor region and the first insulating layer of the memory region by selectively etching the first insulating layer, after the forming of the second insulating layer.

5. The method of claim 1, wherein the first insulating layer and the second insulating layer comprise an oxide layer, and the oxide layer includes a plurality of oxygen vacancies.

6. The method of claim 5, wherein the second insulating layer comprises at least one material selected from the group consisting of an indium oxide layer, a zirconium oxide layer, a gallium oxide layer, and a tin oxide layer.

7. A method for fabricating a semiconductor device, comprising:
forming a variable resistance layer in a memory region of a memory block; and
forming a gate insulating layer in a transistor region of the memory block,
wherein the variable resistance layer and the gate insulating layer are simultaneously formed, and
wherein the memory region comprises:
a plurality of first conductive lines disposed on an interlayer dielectric and under the variable resistance layer; and
a plurality of second conductive lines disposed on the variable resistance layer and crossing over the first conductive lines.

8. The semiconductor device of claim 7, wherein the variable resistance layer and the gate insulating layer are connected to each other.

9. The semiconductor device of claim 7, wherein the transistor region comprises:
a plurality of gate electrodes disposed on an interlayer dielectric under the gate insulating layer;
a channel layer disposed on the gate insulating layer to overlap the gate electrodes; and
a plurality of source electrodes and drain electrodes disposed on the channel layer to overlap a portion of the gate electrodes.

10. The semiconductor device of claim 9, wherein the channel layer comprises an oxide layer or a silicon layer.

11. The semiconductor device of claim 10, wherein the oxide layer comprises at least one material selected from the group consisting of an indium oxide layer, a zirconium oxide layer, a gallium oxide layer, and a tin oxide layer.

* * * * *